US009148945B2

(12) United States Patent
Clavet et al.

(10) Patent No.: US 9,148,945 B2
(45) Date of Patent: Sep. 29, 2015

(54) CIRCUIT ELEMENT, MAGNETIC TRAY, CONNECTION AND WEDGING ELEMENTS FOR PEDAGOGIC HYPERFREQUENCY CIRCUIT, CASE CONTAINING SAME

(75) Inventors: Yann Clavet, Landerneau (FR); Jean-Francois Favennec, Le Relecq Kerhuon (FR); Julien Kerouedan, Brest (FR); Alexandre Manchec, Brest (FR); Cedric Quendo, Saint-Renan (FR); Eric Rius, Le Relecq Kerhuon (FR)

(73) Assignee: ELLIPTIKA, Brest (FR)

( * ) Notice: Subject to any disclaimer, the term of this patent is extended or adjusted under 35 U.S.C. 154(b) by 257 days.

(21) Appl. No.: 13/825,002

(22) PCT Filed: Sep. 22, 2011

(86) PCT No.: PCT/EP2011/066532
§ 371 (c)(1),
(2), (4) Date: Mar. 18, 2013

(87) PCT Pub. No.: WO2012/038511
PCT Pub. Date: Mar. 29, 2012

(65) Prior Publication Data
US 2013/0186673 A1    Jul. 25, 2013

(30) Foreign Application Priority Data

Sep. 22, 2010   (FR) ..................................... 10 57627

(51) Int. Cl.
*H05K 1/00*         (2006.01)
*G09B 7/00*         (2006.01)
(Continued)

(52) U.S. Cl.
CPC ................ *H05K 1/02* (2013.01); *G09B 23/183* (2013.01)

(58) Field of Classification Search
CPC ................................ H05K 1/02; G09B 23/183
USPC ...................... 174/250, 260; 361/760; 434/72, 434/338–340, 343
See application file for complete search history.

(56) References Cited

U.S. PATENT DOCUMENTS 3,594,689 A     7/1971  Hopt et al.
6,943,642 B1 *  9/2005  Takadate et al. ............. 333/24.2
(Continued)

FOREIGN PATENT DOCUMENTS

FR          1478911          4/1967

OTHER PUBLICATIONS

Massimo Goacchini, "B4540—Unite Didactique Hyperfrequences," Electron S.R.L., www.electron.it/pdf/catalogue (May 31, 2009), XP002638517, Retrieved from Internet: URL: http://www.elecron.it/pdf/catalogue/LEAFLET%20B45.40%20%28MICROWAVES%20TRAINER%29.pdf (accessed May 20, 2011).
Anonymous: "Microwave Microstrip Trainer", (Apr. 1, 2010), pp. 1-1, XP002638518, Retrieved from Internet: URL: http://www.bytronic.net/html/7750.html (accessed May 24, 2011).
(Continued)

*Primary Examiner* — Hoa C Nguyen
(74) *Attorney, Agent, or Firm* — Blakely Sokoloff Taylor & Zafman LLP

(57) ABSTRACT

According to the invention, the following are provided:
  a first element (1, 1a) of pedagogic hyperfrequency circuit,
  at least one corresponding magnetic tray (2),
  at least one other second element (1b) of hyperfrequency circuit, similar to the first element (1, 1a), and
  at least one third other corresponding pedagogic hyperfrequency electric connection element (3), separate from the first element (1, 1a),
  which are intended to cooperate together to form a pedagogic hyperfrequency circuit.

15 Claims, 8 Drawing Sheets

Figure 1:
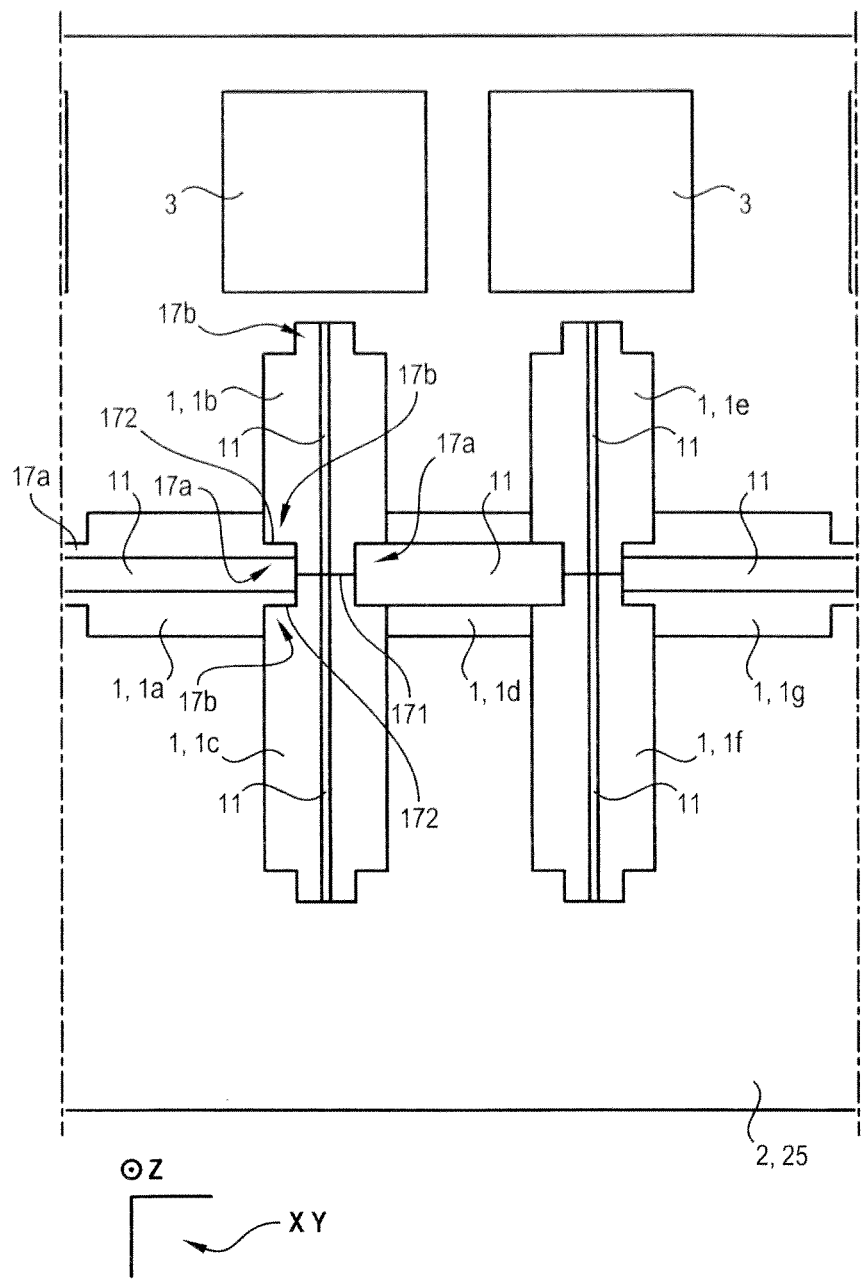

(51) Int. Cl.
*H05K 1/02* (2006.01)
*G09B 23/18* (2006.01)

(56) References Cited

U.S. PATENT DOCUMENTS

| | | | |
|---|---|---|---|
| 8,187,006 B2* | 5/2012 | Rudisill et al. | 439/39 |
| 2003/0098755 A1* | 5/2003 | Basawapatna et al. | 333/17.1 |
| 2008/0013245 A1* | 1/2008 | Schultz et al. | 361/149 |

OTHER PUBLICATIONS

Anonymous: "Microstrip Trainer", (Oct. 20, 2007), p. 1-1 XP002638519, Retrieved from Internet: URL:http//web.archive.org/web/20071020043251/http://italtec.it/fprod72a.htm (accessed May 24, 2011).

Elliptica: "EDUCTIKA(R) by elliptika", (Sep. 23, 2010) pp. 1-2, XP002638528, Retrieved from Internet: URL:http//www.eductika.com/content/DL/Eductika.pdf (accessed May 24, 2011).

* cited by examiner

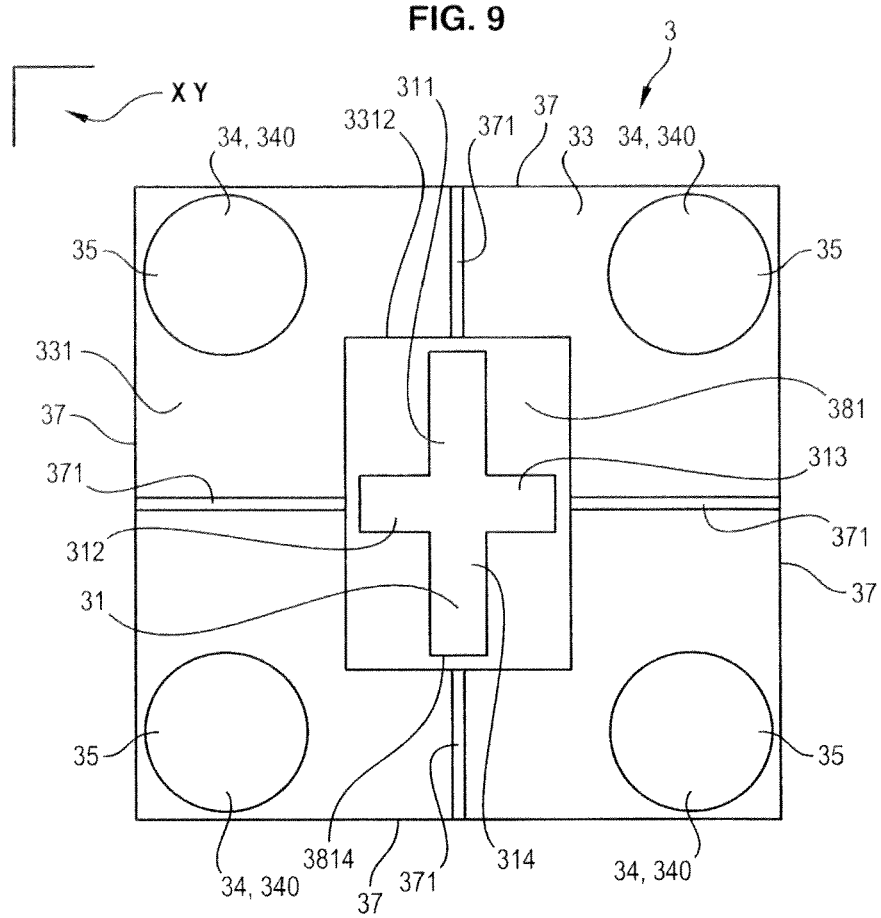
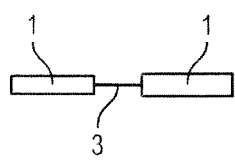
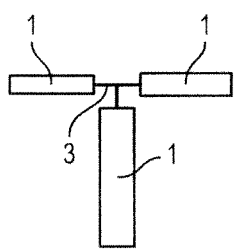
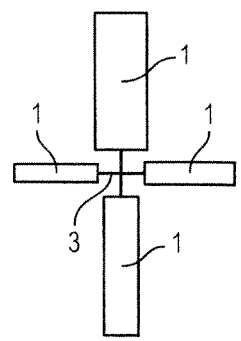

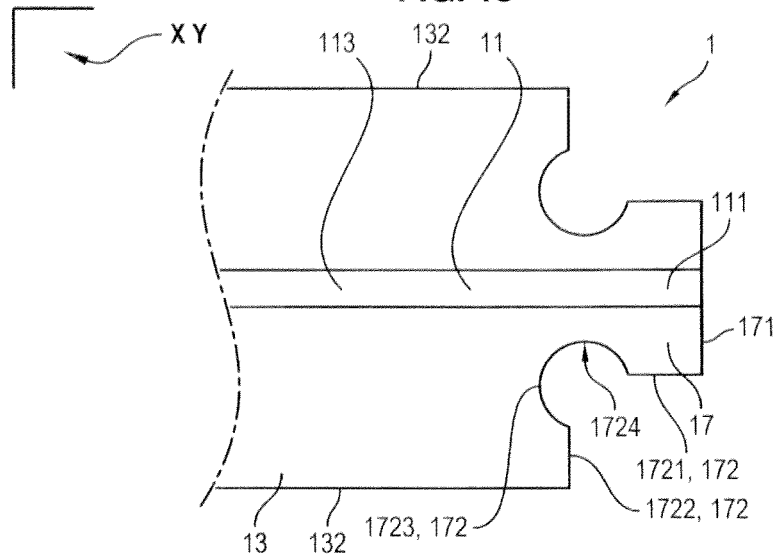
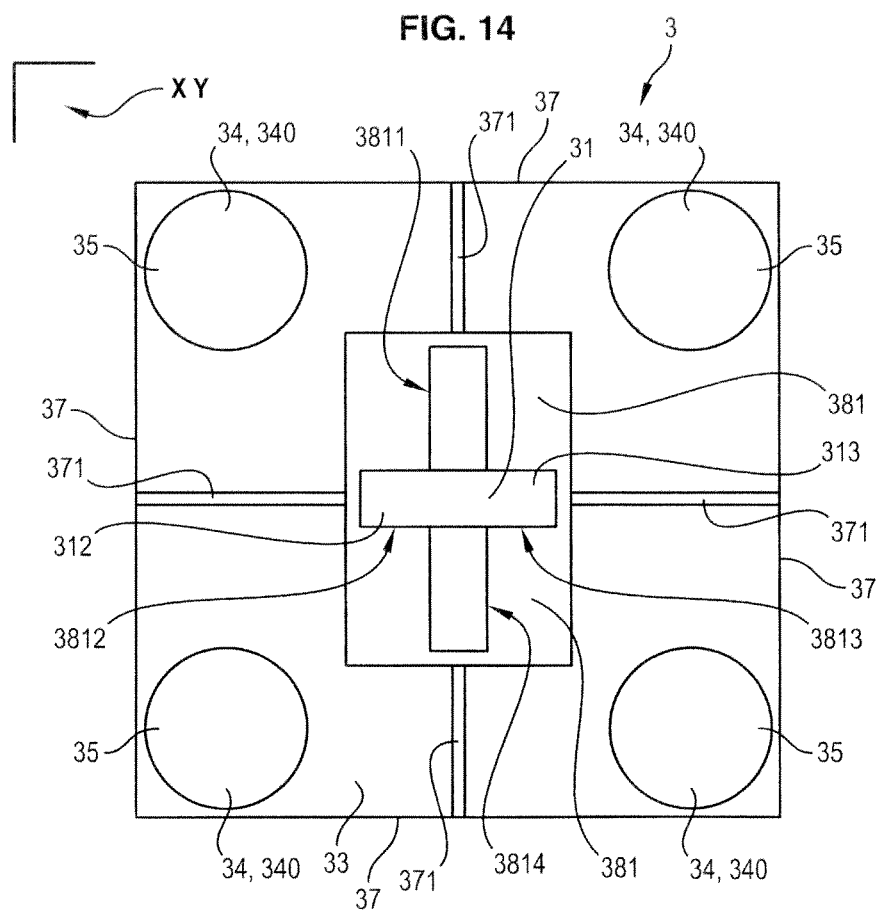

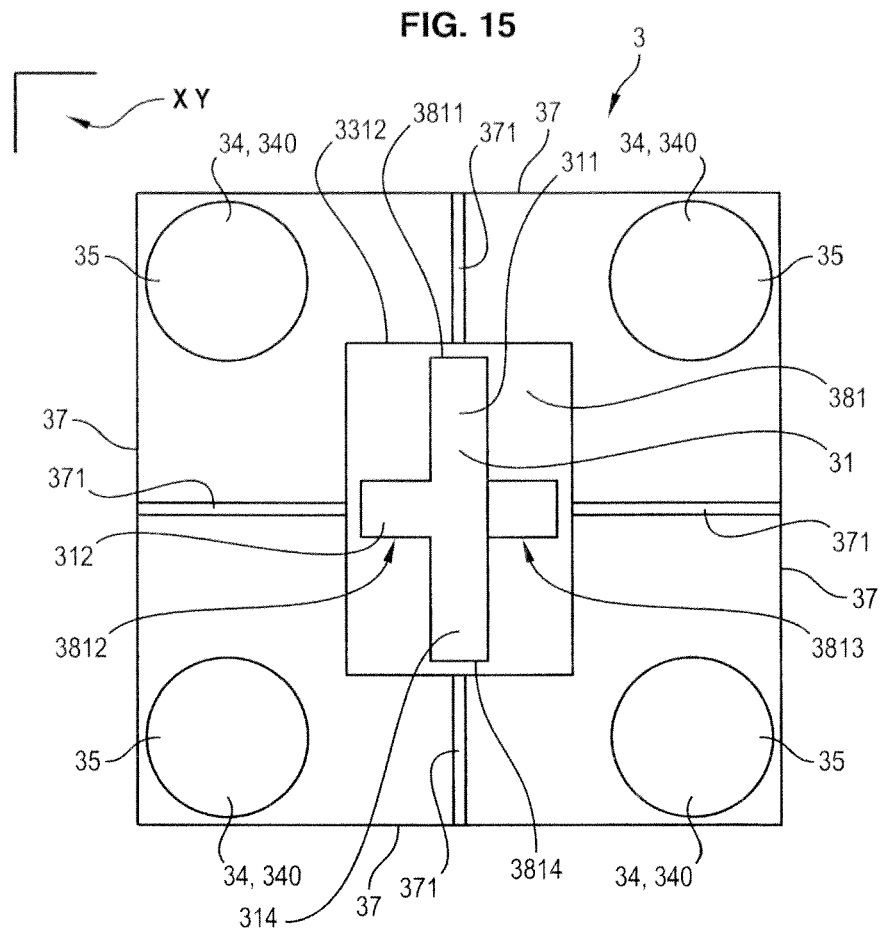

CIRCUIT ELEMENT, MAGNETIC TRAY, CONNECTION AND WEDGING ELEMENTS FOR PEDAGOGIC HYPERFREQUENCY CIRCUIT, CASE CONTAINING SAME

The invention relates to a pedagogic hyperfrequency circuit element.

The aim of such an element is to produce a pedagogic hyperfrequency circuit by assembling with other hyperfrequency components, by way of experiment or to undertake work in a school and more generally in the sector of teaching and research.

The field of hyperfrequencies is in fact a separate profession in the world of electronics, wherein the concepts of guided or free propagation, localised elements, distributed elements, wavelengths, and also planar and volumic technologies have to be mastered.

The connection of lines (copper tracks for example) conveying hyperfrequency signals is a very delicate problem. In fact, to ensure good transmission of signals from one line to the other or from one hyperfrequency function to another, they have to be connected together very carefully. This is done usually by coaxial connectors developed for the frequency range used.

Hyperfrequency lines are inter alia characterised by their characteristic impedance. Characteristic impedance depends on the technology used (for example micro-strip, resonator, or other), characteristics of the substrate (height, dielectric permittivity) on which the line is etched, and of the width of the latter. In hyperfrequency there is a reference value of characteristic impedance: 50 Ohm. It is on the basis of this universal reference value that all functions (filters, couplers, divider and other) of a passive hyperfrequency chain are developed separately. For these different functions to be interconnected, it is necessary to use 50-Ohm connectors. This is why known coaxial hyperfrequency connectors are calculated to have a characteristic impedance of 50 Ohm.

Coaxial connectors are essentially used either to connect a component (filter, couplers, divider or other) to measuring apparatus or to interconnect various passive functions to constitute a hyperfrequency chain.

From a topological viewpoint, in hyperfrequency there are three types of line connection: straight connection, T connection and cross connection.

The use of coaxial connectors is simply not feasible for T connections or cross connections and is problematic for connecting lines of characteristic impedances different to 50 Ohm. In fact, installing coaxial connectors in T or cross shape would be complicated and generate a multitude of parasite phenomena very difficult to compensate. Also, connecting lines of characteristic impedances different from 50-Ohm by 50-Ohm coaxial connectors would also generate very harmful multiples reflections.

Each connected coaxial male or female connector generates around 0.2 dB of loss, which is a disadvantage. Also, connecting hyperfrequency components by means of a multitude of coaxial connectors is long and complicated.

An aim of the invention is to be able to work with a very wide diversity of hyperfrequency structures. Therefore, the aim is to be able to interconnect circuit elements having different hyperfrequency functions and/or different hyperfrequency characteristics to then create a wide diversity of pedagogic hyperfrequency circuits. The student could then test the construction of hyperfrequency circuits which he will have completed by means of the elements to be able to appreciate the consequence of the use of such or such element on the performance of the overall circuit. Therefore, the hyperfrequency function of each element connected in the circuit also must not be perturbed by the connections between the elements and is in the completed overall circuit so it can comply with calculation of the hyperfrequency circuit.

The aim of the invention is to obtain a pedagogic hyperfrequency circuit element, as well as those elements to which it must be connected, which meet these requirements.

For this purpose, a first object of the invention is a pedagogic hyperfrequency circuit element, the hyperfrequency circuit element comprising means for creating a first predefined hyperfrequency function, these means comprising at least one first hyperfrequency electrical conductor and at least one second hyperfrequency electrical conductor which are separated from each other at least by a first electrically insulating support, the element being called first element, characterised in that the first element is intended to cooperate with:
  at least one corresponding magnetic tray, separate from the first element,
  at least one other second corresponding hyperfrequency circuit element, similar to the first element, and
  at least one third other corresponding pedagogic hyperfrequency connection element, separate from the first element, the first element comprising at least one first means for magnetic fastening of the first element to the corresponding magnetic tray, the first element having a determined external surface, configured to the application against a corresponding external surface of the corresponding magnetic tray, the second hyperfrequency conductor of the first element being configured to be connected electrically to a third corresponding electrical conductor provided at least on the corresponding external surface of the corresponding magnetic tray, the first element having at least one first end zone configured to be juxtaposed on the corresponding magnetic tray against at least one other corresponding end zone of the second corresponding element, the second hyperfrequency conductor of the first element being configured to be connected electrically to the second corresponding hyperfrequency conductor of the second corresponding element by means of at least the third corresponding electrical conductor of the corresponding magnetic tray, the first hyperfrequency conductor of the first element being configured to be connected electrically to the first corresponding hyperfrequency conductor of the second corresponding element by means of at least one corresponding electrical conductor of the third corresponding connection element when their end zones are juxtaposed between the tray and the third corresponding connection element having its own magnetic fixing means to the corresponding magnetic tray to form by way of the conductors of the tray and of the first, second and third elements a pedagogic hyperfrequency circuit incorporating at least the first predefined hyperfrequency function.

According to an embodiment of the invention, the element comprises on an external surface at least one alphanumeric character of visual indication of at least one characteristic of the hyperfrequency function.

According to an embodiment of the invention, the first means for magnetic fastening comprise at least one layer of ferromagnetic material.

According to an embodiment of the invention, the first means for magnetic fastening comprise at least one layer of nickel.

According to an embodiment of the invention, the at least one layer of nickel has a thickness greater than or equal to 50 micrometers, and preferably greater than or equal to 100 micrometers.

According to an embodiment of the invention, the second conductor is located between the first support and the first means for magnetic fastening, the determined external surface being conductive of electricity and in electrical contact with the second conductor by means of the first means for magnetic fastening, which is also made of material conductive of electricity.

According to an embodiment of the invention, the first conductor comprises at least one connection part to the corresponding conductor of the third corresponding connection element, this connection part being located on said at least one first end zone.

According to an embodiment of the invention, the first element comprises two first end zones connected together by an intermediate zone, the first conductor extending at least in a first longitudinal direction going between said two first end zones, said two first end zones being less wide, in a second direction transverse to the first longitudinal direction parallel to the determined external surface, than the intermediate zone.

According to an embodiment of the invention, said at least one first end zone of the first element comprises a first rectilinear edge located at its longitudinal end for juxtaposition against the corresponding rectilinear edge of the corresponding longitudinal end of the second other corresponding circuit element, the first rectilinear edge being connected to the intermediate zone by at least one first rectilinear part of lateral edge, the first rectilinear edge being connected to the intermediate zone by at least one first rectilinear part of lateral edge extending in the first longitudinal direction and by at least one second rectilinear part of lateral edge extending in the second transversal direction, the first rectilinear part of lateral edge of the first element being configured to be juxtaposed against the second rectilinear part of lateral edge of another third corresponding hyperfrequency circuit element, similar to the first element, the second rectilinear part of lateral edge of the first element being configured to be juxtaposed against the first rectilinear part of lateral edge of the other third corresponding hyperfrequency circuit element.

According to an embodiment of the invention, the first rectilinear part of lateral edge is connected to the second rectilinear part of lateral edge by at least one curved edge delimiting an internal recess relative to the rectilinear extension of the first and second rectilinear parts of lateral edge.

According to an embodiment of the invention, the determined external surface of the first element comprises grooving.

A second object of the invention, having a link to the first object mentioned hereinabove and intended to cooperate with the latter, even though being physically separate from the latter, is a magnetic tray comprising an external application surface for application against at least one corresponding separate element and comprising means for magnetic fixing of the corresponding element to the external surface of the tray, characterised in that the magnetic tray is intended to cooperate with the elements of:

at least two corresponding first and second separate elements of pedagogic hyperfrequency circuit such as described hereinabove, and at least one third other electrical pedagogic hyperfrequency connection element, the external surface of the magnetic tray comprises a third electrical conductor which is configured to be connected electrically to the second electrical conductor of said at least two corresponding first and second separate elements of pedagogic hyperfrequency circuit, when these corresponding first and second elements are applied by their determined external surface against the external surface of the magnetic tray, the magnetic fixing means of the tray being configured for magnetic fastening, in addition to the corresponding first and second elements, of the third other corresponding connection element which has its own means of magnetic fixing to the magnetic tray and which has a corresponding conductor for electrical connection of the first conductors of the corresponding first and second elements when the and zones of the corresponding first and second elements are juxtaposed between the tray and the third corresponding connection element, to form by way of the conductors of the tray and the first, second and third elements a pedagogic hyperfrequency circuit incorporating at least the first predefined hyperfrequency function.

According to an embodiment of the invention, the magnetic fixing means of the tray comprise at least one layer of plasto-magnet and a magnetic plate, the layer of plasto-magnet being located between the external surface and the magnetic plate, the magnetic fixing means of the tray extending under the entire external application surface and under the third conductor provided on this application surface.

A third object of the invention, having a link to the first object and the second object mentioned hereinabove and intended to cooperate with the latter, even though being physically separate from the latter, is an electrical pedagogic hyperfrequency connection element for connection between at least the first and second elements of hyperfrequency circuit, characterised in that the electrical pedagogic hyperfrequency connection element is intended to cooperate with:

at least one corresponding separate magnetic tray, at least two first and second other corresponding separate elements of pedagogic hyperfrequency circuit such as described hereinabove, the connection element being called third connection element, the connection element comprising means for magnetic fixing to the corresponding magnetic tray and at least one conductor configured to be connected electrically to the first hyperfrequency conductor of the first corresponding element and to the first hyperfrequency conductor of the second corresponding element, when the end zones of the corresponding first and second elements are juxtaposed between the tray and the third connection element, to form by way of the conductors of the first, second and third elements and by at least one conductor provided on a corresponding external surface of the magnetic tray and intended to be connected to the second conductor of the corresponding first and second elements a pedagogic hyperfrequency circuit incorporating at least the first predefined hyperfrequency function.

According to an embodiment of the invention, the magnetic fixing means of the connection element comprise several pins for magnetic fastening to the corresponding magnetic tray, the pins for magnetic fastening being fixed under a substrate insulating electricity to delimit between the pins located in a zone of the substrate enclosing the conductor of the connection element several access sides for several other corresponding separate elements of pedagogic hyperfrequency circuit, the conductor of the connection element covering the first conductor of the other corresponding separate elements of pedagogic hyperfrequency circuit, when these other corresponding separate elements of pedagogic hyperfrequency circuit are arranged in the access sides between the pins and are juxtaposed on the corresponding magnetic tray.

According to an embodiment of the invention, the conductor of the connection element is fixed to the substrate by means of at least one layer made of compressible material for pressing the conductor of the connection element against the first conductor of the other corresponding separate elements of pedagogic hyperfrequency circuit, when the latter and the connection element are fixed by the magnetic fixing means to the corresponding magnetic tray.

According to an embodiment of the invention, the layer made of compressible material is made of foam and the conductor of the connection element is formed by electrically conductive fabric fixed to the layer, According to an embodiment of the invention, the layer made of compressible material comprises, for each access side, a corresponding branch of compressible material, turned towards this access side.

According to an embodiment of the invention, the conductor of the connection element is in the form of a cross comprising two first branches face to face connected to two second branches face to face, each first and second branch being intended to be put in electrical contact with the end of the first conductor of another corresponding separate pedagogic hyperfrequency circuit element.

According to an embodiment of the invention, the conductor of the connection element is in the form of a T comprising a first branch connected to two second branches face to face, each first and second branch being intended to be put in electrical contact with the end of the first conductor of another corresponding separate pedagogic hyperfrequency circuit element.

According to an embodiment of the invention, the conductor of the connection element is of linear form comprising two first branches connected face to face, each first branch being intended to be put in electrical contact with the end of the first conductor of another corresponding separate pedagogic hyperfrequency circuit element.

According to an embodiment of the invention, the layer of compressible material comprises four separate branches of compressible material forming a cross, each first branch of the conductor and each second branch of the conductor covering only one corresponding branch of the four branches of compressible material.

According to an embodiment of the invention, the layer of compressible material comprises four separate branches of compressible material forming a cross, each first branch of the conductor and each second branch of the conductor covering only one corresponding branch of the four branches of compressible material, at least one other of the branches of compressible material being free in not being covered by the conductor of the connection element.

According to an embodiment of the invention, the layer of compressible material extends beyond the conductor of the connection element.

According to an embodiment of the invention, each second branch is longer than each first branch.

According to an embodiment of the invention, the connection element comprises an application surface for application to the corresponding magnetic tray and comprises, on an external surface other than its application surface to the corresponding magnetic tray, a visual marker representing a type and/or a direction of electrical connection, which is used between the other corresponding separate elements of pedagogic hyperfrequency circuit by the conductor of the connection element.

A fourth object of the invention is a wedging element for wedging between a connection element such as described hereinabove and a magnetic tray such as described hereinabove, characterised in that the wedging element comprises at least one support surface free of hyperfrequency electrical conductor and at least one second hyperfrequency electrical conductor, the support surface being separated from the second hyperfrequency electrical conductor at least by a first electrically insulating support, the wedging element being intended to cooperate with:
  at least the corresponding magnetic tray, separate from the wedging element,
  at least one second corresponding hyperfrequency circuit element such as described hereinabove, separate from the wedging element, and
  at least the third other electrical pedagogic hyperfrequency connection element, separate from the wedging element, the wedging element comprising at least one first means for magnetic fastening to the corresponding magnetic tray, the wedging element having a determined external surface, away from the support surface and configured to the application against the corresponding external surface of the corresponding magnetic tray, the wedging element having a second hyperfrequency conductor configured to be connected electrically to the third corresponding electrical conductor provided at least on the corresponding external surface of the corresponding magnetic tray, the wedging element having at least one end zone configured to be juxtaposed on the corresponding magnetic tray against at least one other corresponding end zone of the second corresponding circuit element, the second hyperfrequency conductor of the wedging element being configured to be connected electrically to the second corresponding hyperfrequency conductor of the second corresponding element by means of at least the third corresponding electrical conductor of the corresponding magnetic tray, the support surface of the wedging element being configured to be supported against the third corresponding connection element when the wedging element is inserted between the third connection element and the tray and when the end zones are juxtaposed between the tray and the third corresponding connection element having its own magnetic fixing means to the corresponding magnetic tray, to form by way of the conductors of the tray, of the wedging element and of the second and third elements a pedagogic hyperfrequency circuit incorporating at least the first predefined hyperfrequency function of the second corresponding hyperfrequency circuit element.

A fifth object of the invention is a teaching case, containing a first set of several elements of pedagogic hyperfrequency circuit such as described hereinabove, a second set of several connection elements such as described hereinabove, and at least one magnetic tray such as described hereinabove.

Figure 2:
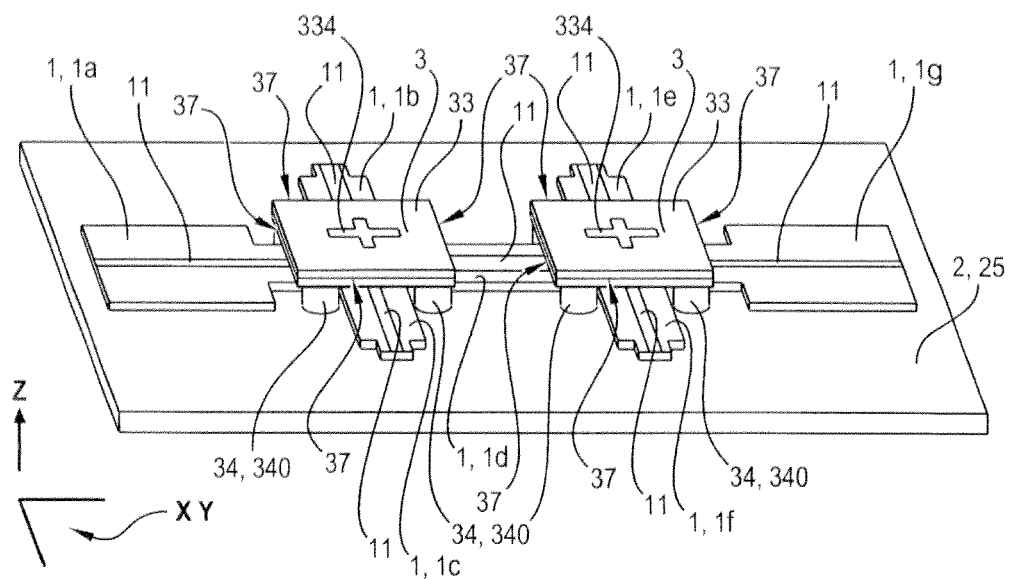
Figure 3:
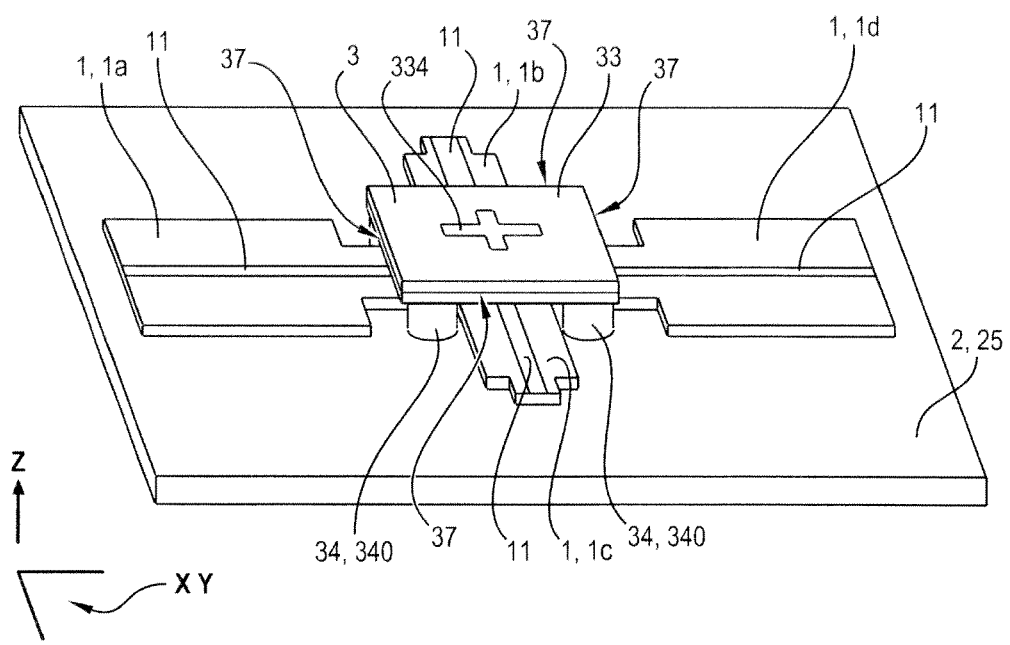
Figure 4:
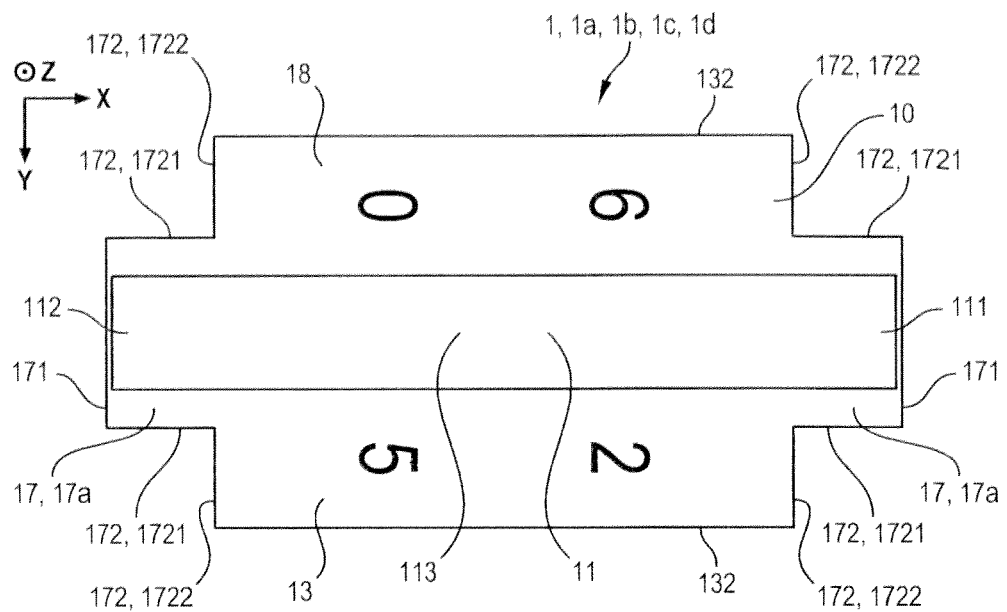
Figure 5:
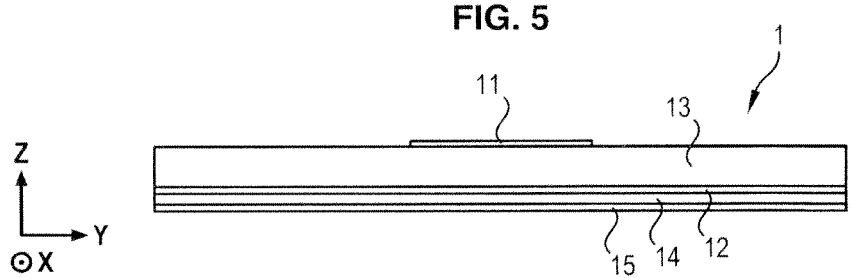
Figure 6:
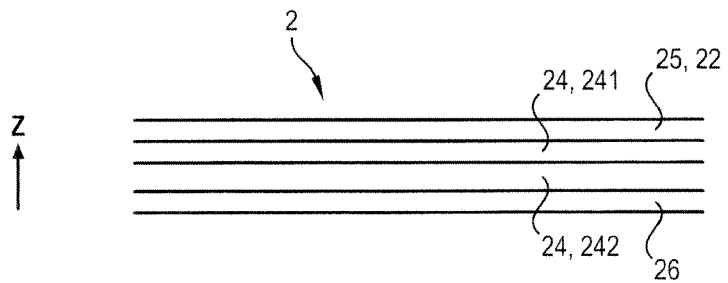
Figure 7:
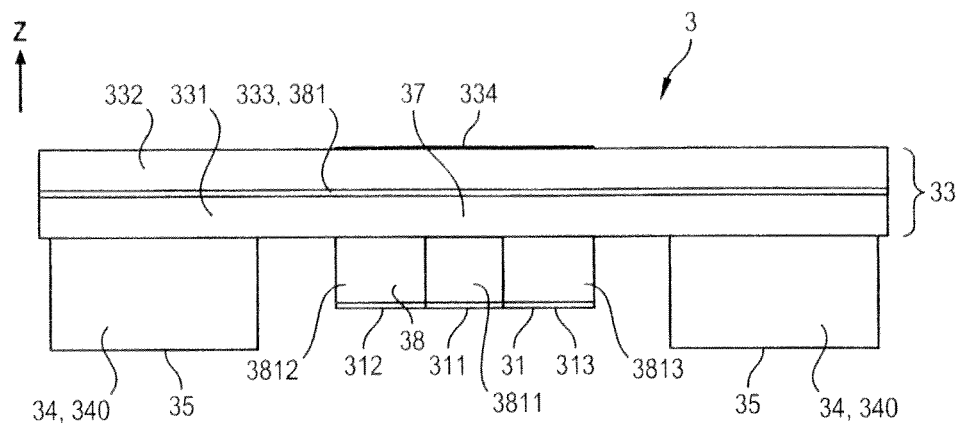
Figure 8:
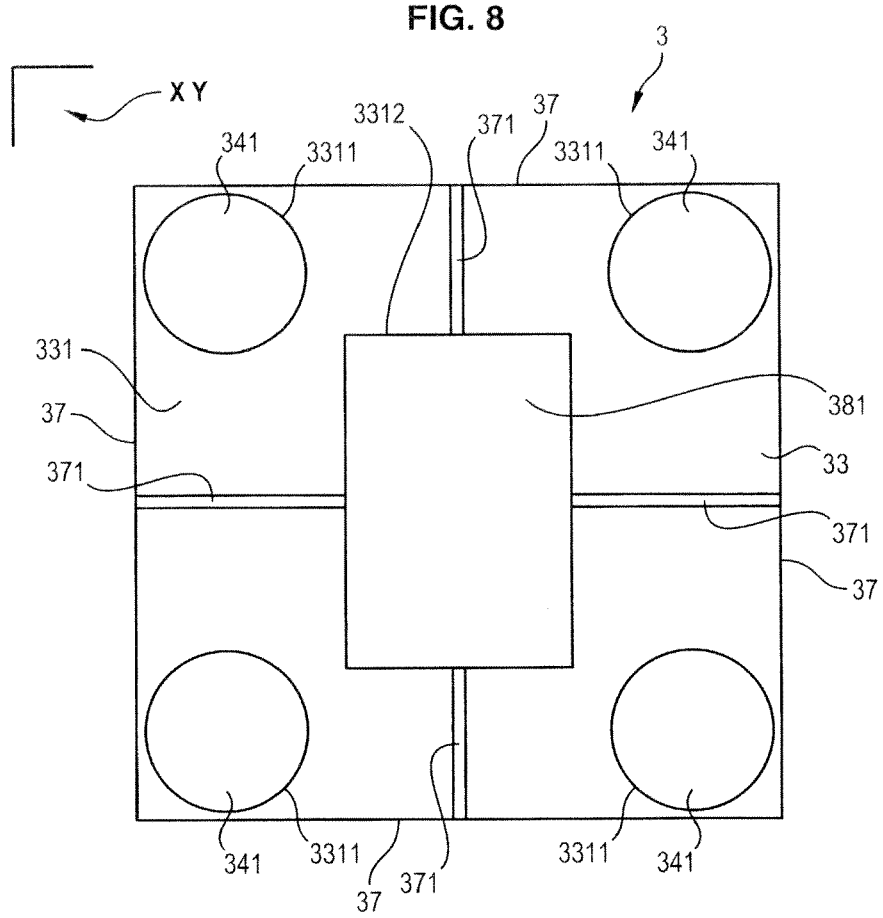
Figure 16:
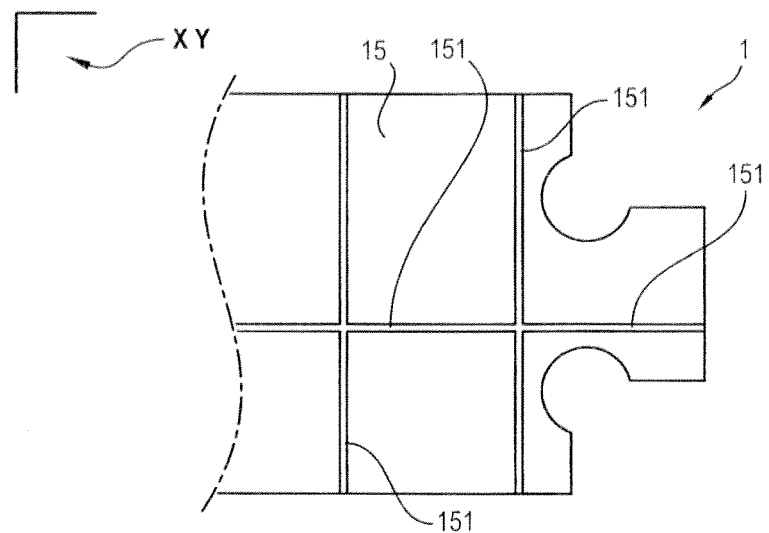
Figure 17:
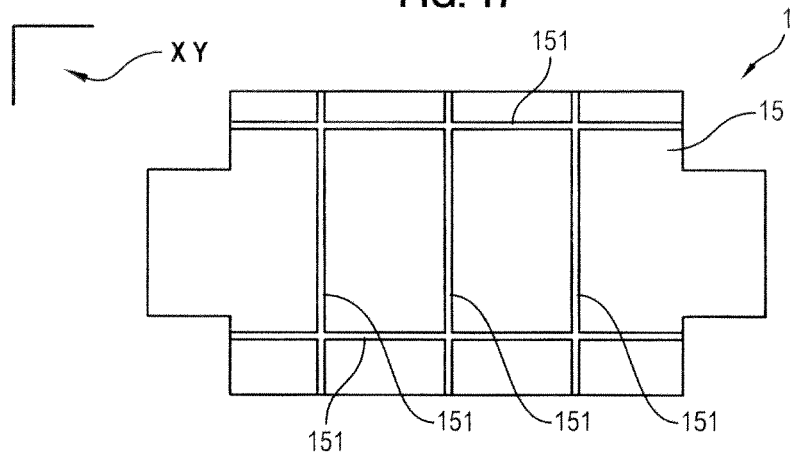
Figure 18:
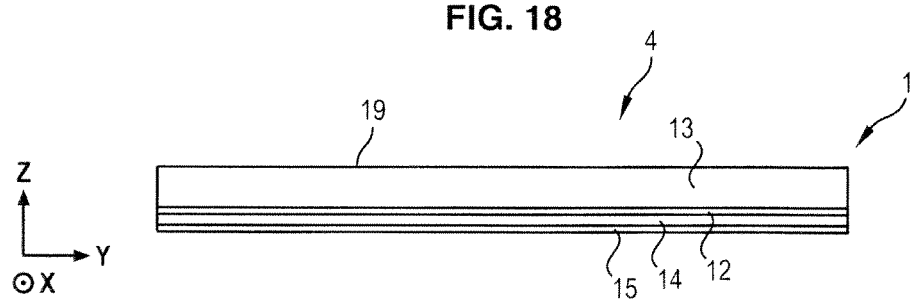

The invention will be more clearly understood from the following description given solely by way of non-limiting example in reference to the attached drawings, in which:

FIG. 1 is a schematic plan view of a hyperfrequency circuit made by means of several circuit elements juxtaposed on a tray according to an embodiment of the invention, FIG. 2 is a schematic view in perspective of the hyperfrequency circuit of FIG. 1 further comprising connection elements for connecting the circuit elements, FIG. 3 is a schematic view in perspective of a hyperfrequency circuit made by means of several circuit elements and a connection element on a tray according to an embodiment of the invention, FIG. 4 is a schematic plan view of a circuit element according to an embodiment of the invention, FIG. 5 is a schematic view in transversal section of a circuit element according to an embodiment of the invention, FIG. 6 is a schematic view in transversal section of the magnetic tray according to an embodiment of the invention, FIG. 7 is a schematic side view of a connection element according to an embodiment of the invention, FIG. 8 is a schematic bottom view of the substrate of the connection element as per FIG. 7, FIG. 9 is a schematic bottom view of the connection element as per FIG. 7, FIG. 10 is a schematic plan view of a connection in cascade of two elements of hyperfrequency circuit, FIG. 11 is a schematic plan view of a T connection between three hyperfrequency circuit elements, FIG. 12 is a schematic plan view of a connection cross between four hyperfrequency circuit elements, FIG. 13 is a schematic plan view of another embodiment of the invention, FIG. 14 is a schematic bottom view of a connection element in cascade between two hyperfrequency circuit elements as per another embodiment of the invention, FIG. 15 is a schematic bottom view of a T connection element between three hyperfrequency circuit elements as per another embodiment of the invention, FIG. 16 is a schematic bottom view of a circuit element according to an embodiment of the invention, FIG. 17 is a schematic bottom view of a circuit element as per another embodiment of the invention, FIG. 18 is a schematic view in transversal section of a wedging element according to an embodiment of the invention.

FIG. 1 shows an example for assembling several elements 1a, 1b, 1c, 1d, 1e, 1f, 1g of a pedagogic hyperfrequency circuit, each designated in general by reference numeral 1. Hyperfrequency means a circuit operating at a frequency of between 300 MHz and 300 GHz. Each element 1 of pedagogic hyperfrequency circuit comprises means for carrying out a first predefined hyperfrequency function, such as for example a propagation line having a predefined length and predefined characteristic impedance. Therefore, each circuit element 1 has characteristics defined in advance, some of which can for example be identified in the form of information legible directly on an external surface 10 of the element 1, for example in the form of alphanumeric characters, such as for example in FIG. 4 the characters 6 and 0 indicating both characteristic impedance of 60 Ohm for the element 1 and the characters 2 and 5 on the other side indicating a line length of 25 mm. These means for carrying out the first predefined hyperfrequency function comprise at least first and second hyperfrequency electrical conductors 11 and 12 separated from each other at least by a first electrically insulating support 13. The elements 1 are for example planar, with the first conductor 11 made for example by deposit or etching on the insulating support 13. The elements are for example of microstrip type, The circuit element 1 further comprises first means 14 for magnetic fastening to a magnetic tray 2.

For example, in an embodiment, the insulating support 13 is formed by a substrate made of dielectric material of predetermined dielectric constant and of predetermined height on the external upper surface 10 of which is the first conductor 11 and on the second lower surface of which is the second conductor 12. For example, the substrate 13 has a predetermined dielectrical constant and a predetermined height, which are identical for all the elements 1. In another embodiment, the substrate 13 has a predetermined dielectrical constant and/or a predetermined height, which are different from one element 1 to another element 1.

This second hyperfrequency electrical conductor 12 is for example formed by a ground plane having a determined thickness according to the direction of the height Z and extending over the entire length and entire width of the element 1 according to the horizontal directions X and Y perpendicular to the direction Z. The first and second conductors are for example formed from metal, for example copper. The second conductor 12 is for example formed by a layer of copper of a thickness of 17 micrometers.

The magnetic fastening means 14 are for example formed by one or more ferromagnetic layer(s) capable of being attracted by one or more magnets 24, 241 provided in the tray 2, this layer or these layers 14 being for example metallic. The magnetic fastening means 14 comprise for example a layer 14 of nickel deposited electrolytically under the second conductor 12 to adhere to the latter and be in electrical contact with the latter, the electrical conductor 12 therefore being between the insulating support 13 and the magnetic fastening means 14, itself also electrical conductive and in electrical contact with the second conductor 12.

In the event where the magnetic fastening means 14 comprise a layer 14 of nickel, this layer 14 of nickel must have a thickness greater than or equal to 50 micrometers, and preferably greater than 100 micrometers to adhere properly to the tray 2.

The external lower surface of the element 1 is formed for example by a metal layer 15 of aspect, fixed to the magnetic fastening means 14, and is formed for example by a coating of nickel and gold under the layer 14 of nickel.

The layers 11, 12, 13, 14, 15 of the element 1 are for example flat, the element 1 having for example a height according to the direction Z, less than its two other dimensions according to the directions X and Y of the plane.

The external lower surface 15 of the element 1 is configured to be applied against an external upper surface 25 of the tray 2. This external upper surface 25 of the tray 2 comprises a third electrical conductor 22 to be in electrical contact with the second electrical conductor 12 of the element 1 when the external lower surface 15 of this element 1 is applied against the surface 25 of the tray 2. In the embodiment described hereinabove, electrical contact between the third conductor 22 and the second conductor 12 is made by means of layers 14 and 15 also conductive of electricity in contact with the second conductor 12. The third conductor 22 of the magnetic tray 2 extends for example over the entire upper surface 25 of the latter to constitute a ground plane in electrical contact with the second conductor 12 for the element 1.

The magnetic tray 2 comprises means 24 for magnetic fastening cooperating with the magnetic fastening means 14 for attaching the circuit element 1 to the external surface 25. These means 24 for magnetic fastening of the tray 2 comprise for example a layer of plasto-magnet 241 and a magnetic plate 242, the layer of plasto-magnet being located between the external surface 25 and the magnetic plate 242. The external surface 25 and its third electrical conductor 22 are for example amagnetic, for example made of stainless steel. The tray 2 further comprises a lower support plate 26 of the means 24 and of the surface 25, as well as means arranged laterally to surround, in the directions X and Y, the means 24 for magnetic fastening and the surface 25, such as for example a frame fixed to the support plate 26. The means 24 for magnetic fastening of the tray 2 extend for example under the entire application surface 25 of the elements 1, 3.

The terms "lower" and "upper" can be omitted, given that when the external surface 15 of the element 1 is applied against the external surface 25 of the magnetic tray 2, the element 1 is fixed to the magnetic tray such that the assembly can be positioned at any inclination.

The element 1 of hyperfrequency circuit comprises at least one end zone 17a, which zone 17a is configured to be juxtaposed on the magnetic tray 2 against at least one other corresponding end zone 17b of another second element 1 of pedagogic hyperfrequency circuit also on the tray 2, as is evident by way of example in FIG. 1, where the end zone 17a of the element 1a is juxtaposed with the end zone 17b of the element 1b and with the end zone 17b of the element 1c. In FIG. 1, the element 1a comprises for example two end zones 17a, the element 1b comprises for example two end zones 17b and the element 1c comprises for example two end zones 17b. In general, the end zones are designated by reference numeral 17. For the same element 1, it is provided two end zones 17, apart from each other for example in the first direction X of the length of the first conductor 11. The different end zones 17 of elements 1 can be fitted into each other on the tray 2 as for a puzzle to form the hyperfrequency circuit, the tray 2 keeping the elements 1 in position in their arrangement selected by the student.

The first conductors 11 of the elements 1 are connected together electrically by a connection element 3 comprising its own means 34 for magnetic fastening to the tray 2. As shown in FIG. 1, the connection element 3 can be fixed on the external surface 25 of the tray 2 independently of the elements 1 by being for example at a distance from the latter as is illustrated in this FIG. 1. Of course, the magnetic attraction force between the tray 2 on the one hand and the elements 1 and the connection elements 3 on the other hand is sufficiently large to keep it in a preferred arrangement relative to the tray 2, but is sufficiently small to move away the elements 1 and the elements 3 relative to the tray 2 when they are fixed thereon, the magnetic fixing means 14, 24 and 34 therefore enabling removable attachment on the tray 2.

The element 3 of electrical connection comprises an electrical conductor 31 for interconnection of the first conductors 11 of different elements 1. The means 34 for magnetic fastening of the connection element 3 comprise for example several pins 340, for example circular, capable of be attracted magnetically by the means 24 for magnetic fastening of the tray 2 when the connection element 3 is applied against the external surface 25 of the latter. The connection element 3 comprises an electrically insulating substrate 33 to which are fixed the pins 340 for magnetic fastening and the electrical conductor 31. The connection element 3 comprises an application surface 35 for application against the external surface 25 of the tray 2 for magnetic fastening to the latter. This application surface 35 is for example formed by the free surface of the pins 340 for magnetic fastening. The distance between the application surface 35 of the element 3 and its substrate 33 is not zero and greater than or equal to the height of the element 1 according to the direction Z at least in its end zone 17 intended to come under the substrate 33 between the application surfaces 35 on the tray 2.

The conductor 31 of the connection element 3 is configured to be in electrical contact with the first conductor or the first conductors 11 of the circuit element or the circuit elements 1 when the application surface 35 is applied against the external surface 25 of the tray 2. The means 34 for magnetic fastening are in the peripheral zone of the substrate 33, that is, near its outer edges, and for example in the corners of the latter for a rectangular substrate 33 or as illustrated substantially square, whereas the conductor 31 is fixed to the substrate 33 in a central zone of the latter, that is, a zone surrounded by the peripheral zone housing the means 34 for magnetic fastening. There is a passage for the circuit elements 1 under the substrate 33 in the peripheral zone housing the means 34 for magnetic fastening, so that the conductor 31 can cover the first conductor 11 of the elements 1. For example, the first conductor 11 extends as far as the end zones 17 of the elements 1 in the embodiment illustrated in the figures, the pins 340 for magnetic fastening which protrude under the substrate 33 are spaced apart for allow passage of an element 1 between two pins 340, the spread distance between two pins 340 located on each peripheral side 37 of the substrate 33 being greater than the transversal width of the element 1 according to the direction Y. The connection element 3 in this case therefore comprises four peripheral sides 37 for insertion of a circuit element 1 under the substrate 33 between the pins 340.

The form of the conductor 31 under the substrate 33 determines the type of electrical connection made between the elements 1. For example, in the embodiment illustrated in FIGS. 1, 2, 3, 7 and 9, the connection element 3 is of the cross connector type according to FIG. 12, for connecting together the four first conductors 11 of the four different circuit elements 1. As is illustrated in FIG. 9, the conductor 31 of this cross connection element 3 is itself in the form of a cross having four branches 311, 312, 313, 314 connected together, whereof each is intended to be applied against the first conductor 11 of a different element 1, and this for example at the level of the first conductor 11 located on the end zones 17 of each element 1.

The first conductor 11 of the element 1 comprises at least one first connection part 111 to the conductor 31 of the connection element 3 and at least one second connection part 112 to the conductor 31 of another connection element 3, these first and second connection parts 111 and 112 of the first conductor 11 being distant from each other in the first longitudinal direction X of the element 1 by being connected together by a third intermediate part 113 of the first conductor 11. The first and second connection parts 111, 112 are for example located at the longitudinal ends of the first conductor 11 which are in turn located for example on the end zones 17 of the element 1. Each connection part 111, 112 of the element 1 is in electrical contact with one of the branches 311, 312, 313, 314 of the conductor 31 of the element 3 for their connection electrical, when the connection element 3 is arranged above the circuit elements 1 juxtaposed on the magnetic tray 2. Therefore, for example to make a cross connection of four circuit elements 1a, 1b, 1c and 1d in FIG. 1, the student places the connection element 3 of FIG. 9 above the juxtaposed end zones 17 of these elements 1a, 1b, 1c, 1d, with the substrate 33 partly covering the elements 1a, 1b, 1c and 1d and the pins 340 arranged directly on the external surface 25 of the tray 2 at the side of the elements 1a, 1b, 1c, 1d to span them and ensure magnetic fastening of the element 3 to the tray 2. Consequently, the first conductors 11 of the elements 1a, 1b, 1c, 1d pass by the four access sides 37 of the connection element 3 under the substrate 33 between the pins 340 and under the conductor 31 to be in electrical contact with the latter. The configuration of the branches of the conductor 31 is such that each branch 311, 312, 313, 314 is in electrical contact respectively with a connection part 111 or 112 of the first conductor 11 of the elements 1a, 1b, 1c, 1d. The magnetic attraction force of the substrate 33 to the tray 2 stresses the first conductor 31 to be applied against the first conductor 11 of the elements 1. The conductor 31 is for example fixed to the substrate 33 by means of a layer 38 of foam capable of being compressed under the effect of the magnetic attraction force of the substrate 33 to the tray 2, to lean the conductor 31 against the first conductors 11 of the elements 1 located between this conductor 31 and the external surface 25 of the magnetic tray 2. The pins 340 and the layer 38 of foam are fixed to the first lower surface of the substrate 33, each by means of for example a respective layer of adhesive, of reference numeral 341 for the pins 340 and of reference numeral 381 for the layer 38 of foam, as is illustrated in FIG. 8, where the lower surface of the substrate 33 has been illustrated with these layers 341, 381 of adhesive before being placed above the pins and the layer of foam to be fastened to the substrate 33.

Another cross connection element 3 can also be used to join together the conductors 11 of the elements 1*d*, 1*e*, 1*f* and 1*g* of FIG. 1, as is illustrated in FIG. 2 and so on to electrically connect several juxtaposed elements 1 on the magnetic tray 2.

The student can now construct a wide variety of hyperfrequency circuits, given the wide possible diversity of the hyperfrequency function used by each element 1 and the large number of possible connections of these elements 1 by the connection elements 3 on the tray. Circuit elements 1 can also be provided whereof the conductor 1 terminates in a coaxial connector fixed above (the other side relative to the face opposite the application face 15) to enable connection to a conventional coaxial connector, for example for sending or receiving signals in the hyperfrequency circuit.

In an embodiment, the layer 38 of foam for example has the same form as the conductor 31, the layer 381 of the adhesive for example able to be of general rectangular form surrounding the layer 38 of foam.

In the embodiments illustrated in FIGS. 9, 14 and 15, the layer of foam 38 has a branch turned towards each access side 33 and therefore towards each element 1, 4, the branches being connected together. Consequently, in FIGS. 9, 14 and 15, the layer of foam 38 is in the form of a cross comprising respectively four separate branches 3811, 3812, 3813 and 3814. The branches 3812 and 3813 are located opposite each other and are shorter than the two other branches 3811 and 3814 located opposite each other. In FIG. 9, for the connection element 3 in the form of a cross, the branches 3811, 3812, 3813 and 3814 of foam are located respectively between the branches 311, 312, 313 and 314 of the conductor 31 and the substrate 33 and therefore have a cross form corresponding to the cross form of the conductor 31. In FIG. 14, for the connection element 3 of linear form, the branches 3811, 3812, 3813 and 3814 of foam have a cross form with the branches 3812 and 3813 located respectively between the branches 312 and 313 of the conductor 31 and the substrate 33, the branches 3811 and 3814 not being covered by the absent branches 311 and 314, these branches 3811 and 3814 of foam therefore being free, naked and free of conductor. In FIG. 15, for the connection element 3 in the form of a T, the branches 3811, 3812, 3813 and 3814 of foam are a cross form with the branches 3811, 3812 and 3814 located respectively between the branches 311, 312 and 314 of the conductor 31 and the substrate 33, the branch 3813 not being covered by the absent branch 313, this branch 3813 of foam being therefore free, naked and free of conductor.

In another embodiment, not illustrated, the layer 38 of compressible material extends beyond the conductor 31 of the connection element 3, for example by surrounding this conductor 31, for example being of rectangular form and occupying the central zone of the substrate 33, corresponding to the layer 381 of adhesive of FIG. 8.

The conductor 31 of the connection element 3 is for example formed by fabric conductive of electricity, such as fabrics used in clothing to create electromagnetic compatibility. This fabric is adhered by another layer of adhesive to the layer 38 of foam.

The substrate 33 comprises for example two superposed parts 331 and 332, with the part 331 comprising through-holes 3311, whereof the dimensions correspond to the pins 340. The part 331 of the substrate also comprises a continuous central opening 3312, the dimensions of this central opening 3312 being greater than that of the layer 38 of foam and of the conductor 31 so it can contain several types of conductors 31. The first part 331 of the substrate is fixed to the second part 332 of the substrate 33 by an intermediate layer 333 of adhesive, extending also in the holes 3311 and the opening 3312 and therefore also forming the layers 341, 381 of adhesive. This layer of adhesive 333, 341, 381 extends for example over the entire lower surface of the part 332. Consequently, the holes 341 and the opening 3312 correctly position the pins 340, the foam 38 and the conductor 31 and fix them against the second part 332 of the substrate 33.

The substrate 33 is for example flat, as is the conductor 31, the element 3 having for example a height according to the direction Z, less than its two other dimensions according to the directions X and Y of the plane. The pins 340 are for example circular in cross-section, viewed in transversal section in a plane parallel to the tray 2 when they are applied above, as is illustrated in FIGS. 3, 7, 8 and 9, but can also have any cross-section transversal to their direction of application, such as for example a rectangular cross-section, as is illustrated in FIG. 2.

On the same circuit element 1, the end zones 17 intended to be juxtaposed to another second element 1 are for example at least partially cuneiform. The end zone 17 comprises for example a rectilinear edge 171 to the longitudinal end of the zone 17, this edge 171 extending for example perpendicularly to the longitudinal direction X, that is, according to the transversal direction Y, such that two elements 1*b* and 1*c* can be juxtaposed by their edges 171 when put against each other, with their conductor 11 initially extending in the same direction remaining parallel to this same direction in the extension of each other, as is illustrated in FIG. 1. On the same element 1, the end zones 17 have a width, according to the transversal direction Y, which is less than the intermediate zone 18 of the element 1 connecting its two end zones 17, to be able to juxtapose four elements 1*a*, 1*b*, 1*c*, 1*d* by their end zone 17, with the two elements 1*b* and 1*c* juxtaposed by their edge 171 of longitudinal end. Consequently, the end edges 171 of the elements 1*a* and 1*d* are separated from each other by the end zones 17*b* of the other elements 1*b* and 1*c*. The intermediate zone 18 of each element 1 is connected to the edges 171 of the longitudinal ends by second lateral edges 172. The lateral edges 172 of the end zones 17, connected to the edge 171, have a form configured to enable insertion of the end zone 17*a* of the first element 1*a* between the lateral edges 172 of the second and third elements 1*b* and 1*c* juxtaposed by their first edge 171. The lateral edges 172 are for example wholly rectilinear. The lateral edges 172 for connection of the edge 171 of the longitudinal end to the intermediate zone 18 comprise for example a first lateral connection edge 1721 at a right angle to the rectilinear edge 171 and a second rectilinear connection lateral edge 1722 at a right angle to the transversal edge 132 transversally delimiting the intermediate zone 18 of the element 1 according to the direction Y. As is illustrated by way of example in FIGS. 1 to 4, the first lateral rectilinear edge 1721 joins the second lateral edge rectilinear 1722 at right angles. Consequently, in FIG. 1, the end zone 17*a* of the element 1a is inserted between the two second lateral edges 1722 of the two other elements 1b and 1c juxtaposed by their edge 171 of longitudinal end. The transversal width of the end zone 17 according to the direction Y is less than or equal to twice the length of the first lateral edges 1721 according to the direction X. The transversal width of the second lateral edges 1722 of the end zone 17 according to the direction Y is less than or equal to the length of the first lateral edges 1721 according to the direction X.

Consequently, this creates nesting of the circuit elements 1 of puzzle type. The different circuit elements 1 constitute not only the different pieces of the puzzle to be juxtaposed against each other, but also and in contrast to a puzzle in the classic sense, in which the pieces of the puzzle must reproduce an image by assembling, the different elements 1 are interchangeable in each arrangement, that is, for example in FIGS. 1 to 3, the element 1d can be arranged in place of the element 1a, whereas the element 1a can be arranged in place of the element 1d.

The lateral joining edges 172 of the edge 171 of the longitudinal end to the intermediate zone 18 of the element 1 can also comprise curved parts, such as for example in the embodiment of FIG. 13. In FIG. 13, the lateral edges 172 retain their first part 1721 of rectilinear linking and at right angles to the edge 171 of the longitudinal end and their second part 1722 of rectilinear linking and at right angles to the transversal edge 132 of the intermediate zone 18, but then continue via a recess 1724 made towards the interior to remove the extension of these rectilinear parts 1721 and 1722 towards each other. The rectilinear parts 1721 and 1722 are therefore interconnected by a third curved lateral edge 1723, for example circular as illustrated in FIG. 13. Therefore, in this embodiment, when two rectilinear edges 171 of two elements 1b and 1c are arranged against each other, the end zone 17a of the element 1a is inserted between the end zones 17b of the elements 1b and 1c, by the fact that the rectilinear edge 171 of the longitudinal end of this element 1a is abutting against the aligned rectilinear parts 1721 of the elements 1b and 1c, the recess 1724 of the three elements 1a, 1b and 1c enabling some degree of liberty between them to ensure in all cases that they can be juxtaposed so they can then be covered by the connection element 3, with it being ensured that the branches of the conductor 31 are applied properly against the connection parts 111, 112 of the first conductor 11 of the elements. Consequently, the lateral edges 172, 1721, 1722, 1723, may not be of complementary shape to each other when two elements 1 are juxtaposed by these edges.

In the embodiment of the cross connection element 3 of FIG. 9, the branches 312 and 313 opposite each other of the conductor 31, provided to link between the connection parts 111 of the first conductors 11 juxtaposed by their rectilinear edges 171 at their longitudinal end are shorter than the two other branches 311 and 314 located opposite each other, which have been provided for electrical connection with the connection parts 111 of the first conductors 11 of the elements 1a and 1d, whereof the edges 171 at their longitudinal end are separated from each other by the elements 1b and 1c.

In the embodiment illustrated in FIG. 14, the conductor 31 of the connection element 3 is provided to make a linear cascade connection between two circuit elements 1 located opposite each other and comprises only the two small branches 312 and 313 located in extension of each other and forming for example a rectangle, to connect the connection parts 111 of the two elements 1 juxtaposed by their rectilinear edge 171 at their longitudinal end, such as for example the elements 1b and 1c of FIG. 1, by omitting the elements 1a and 1d, to make the straight connection of two elements 1 located opposite each other, as in FIG. 10.

In the embodiment of FIG. 15, the connection element 3 is provided to make an electrical T connection between three elements 1 as illustrated schematically in FIG. 11, and comprises three of the four branches 311, 312, 313, 314 of FIG. 9 in omitting one of these branches. For example, in FIG. 15, the conductor 31 of the element 3 comprises the two long branches 311 and 314 opposite each other for electrical connection to the connection part 111 of the first conductor 11 respectively of elements 1a and 1d in FIG. 1, and the second branch 312 shorter than each of the two first long branches 311 and 314, this short branch 312 being provided for electrical connection with the connection part 111 of the first conductor 11 of the element 1b, the other short branch 313 of FIG. 9 being omitted in FIG. 15 for connection of the first conductors 11 of the three elements 1a, 1b and 1d of FIG. 1 in omitting the element 1c.

The differences in length between the short branches 312, 313 and the long branches 311 and 314 specify that the first conductors 11 are not covered by an excessively long length of the conductor 31, so as not to generate a hyperfrequency parasite effect on transmission of signals between the elements 1 connected in this way.

The type of connection and the type of connection made by the element 3 are for example indicated by a visual marker 334 on the upper surface of its substrate 33, that is, on its face away from the means 34 for magnetic fastening. Therefore, in the embodiments described hereinabove, this visual marker 334 is for example a cross for the type of cross connection element 3 of FIG. 9, this cross marker design also having two long branches face to face and two short branches face to face in the same direction as the branches 311, 312, 313 and 314, to act as a key for the type of arrangement of the element 3 relative to the elements 1. This visual marker 334 on the upper surface of the substrate 33 is applied thereto for example by screen printing.

In an embodiment illustrated in FIGS. 8, 9, 14 and 15, the substrate 33 comprises on the side turned towards the conductor 31 another visual marker 371, such as for example a screen printed line, to make a visual implantation mark of the layer 38 of foam and of the conductor 31 during manufacture of the element 3. There is for example visual marking 371 for each of the four sides 37 in FIG. 9. The visual markings 371 can be the mid-bisectors of the sides 37 to form a sight at the centre of which is the implant zone of the layer 38 of foam and of the conductor 31.

In an embodiment illustrated in FIGS. 16 and 17, the external application surface 15 of the element 1 against the external surface 25 of the tray 2 comprises grooving 151, which diminishes tensions during depositing of the layer 14 and avoids warping during manufacture. Also, each hollow of the grooving 151 can absorb minor flexion to ensure evenness of the element 1 when it is pressed by magnetic force against the tray 2. The grooving 151 is for example in the form of a grid with perpendicular rectilinear mesh. The conductive material of the layer 15 and/or of the layer 14 is also located in the grooving 151.

The magnetic force exerted by the magnetic tray 2 on the pins 340 causes compression of the low-density foam 38, ensuring that the elements 1 and the electrical continuity between the conductors 11 of these elements 1 are maintained, The substrate 33, 331, 332 is for example made of epoxy. The pins 340 are for example made of soft steel. The conductors 11 are for example etched onto the support 13. A top layer of an alloy of nickel and gold can also be provided on the conductor 11, the conductor 11 being located between its support 13 and this additional top layer.

The plane XY indicated in the figures contains the directions X and Y perpendicular to each other and represents the plane of the external surface 25 of the tray 2 and the plane of the external application surfaces 15, 35 of the elements 1 and 3.

FIG. 18 represents an embodiment of a fourth wedging element 4 similar to the circuit element 1 but not participating in the hyperfrequency circuit because this wedging element 4 does not comprises a first hyperfrequency electrical conductor 11 on its upper surface 19. Consequently, such a wedging element 4 is a circuit element 1 without first hyperfrequency electrical conductor 11. This upper surface 19 serves as support surface 19 for the connection element 3 when the wedging element 4 is inserted between this connection element 3 and the tray 2 in the place of a circuit element 1 so a to compensate the fact that the circuit element or the other circuit elements 1 located under the connection element 3 lift slightly and optionally make the latter lean. For example, in the embodiments of FIGS. 14 and 15, a wedging element 4 is inserted between each branch free of foam and the tray 2 to counterbalance the force exerted by the other circuit elements 1 against the branches of the conductor 31 of the connection element 3. Therefore, in FIG. 15, the branches 311, 312 and 314 of the conductor 31 of the connection element 3 are supported against the conductor 11 of the elements 1a, 1b and 1d, whereas the free branch of foam 3813 not covered by conductor is supported against the support surface 19 of the wedging element 4. In FIG. 14, the branches 312 and 313 of the conductor 31 of the connection element 3 are supported against the conductor 11 of the elements 1a and 1d, whereas the free branch of foam 3811 not covered by conductor is supported against the support surface 19 of a wedging element 4 and the free branch of foam 3814 not covered by conductor is supported against the support surface 19 of another wedging element 4. The wedging element 4 comprises the same constituent parts as the circuit element 1, specifically 12, 13, 14, 15 except if there is no conductor 11 on its support surface 19 facing away from its application surface 15.

By way of non-limiting example, the circuit illustrated in FIG. 1 makes a hyperfrequency circuit DBR of the order of 2.

Therefore, according to the invention, it is provided to constitute the pedagogic hyperfrequency circuit, a set of several elements 1, 1a, 1b, 1c, 1d of pedagogic hyperfrequency circuit and of one or more connection elements 3 and one or more magnetic trays 2. For example, this set and this tray or these trays can be stowed in a portable case or any container, comprising for example different 3U compartments for stowing the elements 1 in one compartment, the element or the elements 3 in another compartment, the tray or the trays in another compartment, or for stowing elements 1 of different type (hyperfrequency function different by at least one characteristic such as for example characteristic impedance and/or the line length 11) in different compartments, elements 3 of different type and/or of different direction of connection in different compartments. The case can also contain one or more wedging elements 4.

This case and more generally the tray and the elements 1, 3 make a large number of hyperfrequency circuits, with simple and rapid execution, for easily associating the different elements of the circuit. The invention presents numerous advantages relative to conventional coaxial connectors which prove to be totally inadequate for compactness. In relation to conventional coaxial connectors, the invention generates few losses (under 0.08 dB per element 3), few reflections, can be used for different types of connection: straight connection (linear in cascade). T or cross connection for example, can be used to connect lines 11 having different and any characteristic impedances, and even possibly different lines of 50 Ohm, is easy and rapid to install, robust, demountable and reusable.

The invention makes prototypes of hyperfrequency circuits technologically very close to those originating from industrial processes. The invention authorises precise adjusting of the hyperfrequency functions of elements, producing circuits the responses of which will be optimised, all with the aim of evaluating interest in novel topology of a hyperfrequency circuit or the feasibility or impact of modification to the hyperfrequency circuit.

The invention enables a high level of flexibility in arranging the elements 1 constituting the devices studied. The element 1 can comprise a complete hyperfrequency function, such as for example a filter, a coupler, a divider or other.

A pedagogic hyperfrequency circuit element (1, 1a) is provided, characterised in that the hyperfrequency circuit element (1, 1a) is planar and comprises at least one first hyperfrequency electrical conductor (11) and at least one second hyperfrequency electrical conductor (12), which are separated from each other at least by a first electrically insulating support (13) to form a hyperfrequency propagation line (11) capable of operating at a frequency of between 300 MHz and 300 GHz, the element (1, 1a) being called first element (1, 1a), the first electrically insulating support (13) is formed by a substrate made of dielectric material of predetermined dielectric constant and of predetermined height on the external upper surface (10) of which is the first conductor (11) and on the second lower surface of which is the second conductor (12), the second conductor (12) is located between the first support (13) and at least one layer (14) of ferromagnetic material for magnetic fastening of the first element (1, 1a) to a corresponding magnetic tray (2), separate from the first element (1), the first element (1, 1a) having a determined external surface (15), configured for the application against a corresponding external surface (25) of the corresponding magnetic tray (2), the determined external surface (15) being conductive of electricity and in electrical contact with the second conductor (12) by means of the layer (14) of ferromagnetic material, which is also made of material conductive of electricity, the second hyperfrequency conductor (12) of the first element (1, 1a) forming a ground plane to be connected electrically to a third corresponding electrical conductor (22) provided at least on the corresponding external surface (25) of the corresponding magnetic tray (2), the first element (1, 1a) having at least one first end zone (17, 17a) configured to be juxtaposed on the corresponding magnetic tray (2) against at least one other corresponding end zone (17, 17b) of another corresponding second element (1b) of hyperfrequency circuit, similar to the first element (1, 1a), the first conductor (11) comprises on said at least one first end zone (17) at least one connection part (111, 112) for connection by covering to the corresponding conductor (31) of a third corresponding connection element (3) of pedagogic hyperfrequency electric, separate from the first element (1, 1a), the second hyperfrequency conductor (12) of the first element (1, 1a) being configured to be connected electrically to the second corresponding hyperfrequency conductor (12) of the second corresponding element (1b) by means of at least the third corresponding electrical conductor (22) of the corresponding magnetic tray (2), the first hyperfrequency conductor (11) of the first element (1, 1a) being configured to be connected electrically to the first corresponding hyperfrequency conductor (11) of the second corresponding element (1b) by means of at least one corresponding electrical conductor (31) of the third corresponding connection element (3) when their end zones (17, 17a, 17b) are juxtaposed between the tray (2) and the third corresponding connection element (3) having its own means (34) for magnetic fastening to the corresponding magnetic tray (2), to form by way of the conductors (22, 11, 12, 31) of the tray (2) and of the first, second and third elements (1, 1a, 1b, 3) a pedagogic hyperfrequency circuit incorporating at least one first predefined hyperfrequency function.

In an embodiment, the element 1 is for example of microstrip type.

In an embodiment, the curved edge 1723 is circular.

In an embodiment, the transversal width of the end zone (17) in the second transversal direction (Y) is less than or equal to twice the length of the first rectilinear part (1721) of lateral edge (172) in the first longitudinal direction (X).

In an embodiment, the transversal width of the second rectilinear part (1722) of lateral edge (172) in the second transversal direction (Y) is less than or equal to the length of the first rectilinear part (1721) of lateral edge (172) in the first longitudinal direction (X).

A magnetic tray (2) is also provided, comprising an external application surface (25) against at least one corresponding separate element (1, 3) and comprising means (24) for magnetic fastening of the corresponding element (1, 3) to the external surface (25) of the tray, characterised in that the external surface (25) of the magnetic tray (2) comprises a third electrical conductor (22), which extends over the entire upper surface (25) of the latter to constitute a ground plane of electrical contact with a second electrical conductor (12) of at least two corresponding first and second separate elements (1, 1a, 1b) of pedagogic hyperfrequency circuit, when these corresponding first and second elements (1, 1a, 1b) are applied by their determined external surface (15) against the external surface (25) of the magnetic tray (2), the means (24) for magnetic fastening of the tray extend under the entire application surface (25) and being configured for magnetic fastening, in addition to the corresponding first and second elements (1, 1a, 1b), of a third other corresponding pedagogic hyperfrequency electric connection element (3) which has its own means (34) for magnetic fastening to the magnetic tray (2) and which has a corresponding conductor (31) for electrical connection of the first conductors (11) of the corresponding first and second elements (1, 1a, 1b) when the end zones (17, 17a, 17b) of the corresponding first and second elements (1, 1a, 1b) are juxtaposed between the tray (2) and the third corresponding connection element (3) to form by way of the conductors (22, 11, 12, 31) of the tray (2) and of the first, second and third elements (1, 1a, 1b, 3) a pedagogic hyperfrequency circuit incorporating at least one first predefined hyperfrequency function.

In an embodiment, the external surface (25) and the third electrical conductor (22) are amagnetic.

A pedagogic hyperfrequency electrical connection element t (3) between several other elements (1, 1a, 1b) of hyperfrequency circuit is also provided, characterised in that the connection element (3) is called third connection element (3), the connection element (3) comprising a substrate (33) insulating electricity, a conductor (31) and several pins (340) for magnetic fastening to a corresponding separate magnetic tray (2), the pins (340) for magnetic fastening being fixed under the substrate (33) insulating electricity to delimit between the pins (340) located in a zone of the substrate (33) enclosing the conductor (31) several access sides (37) for the other corresponding separate elements (1a, 1b, 1c, 1d) of pedagogic hyperfrequency circuit, the conductor (31) of the connection element (3) covering and being connected electrically to the first conductor (11) of the other corresponding separate elements (1a, 1b, 1c, 1d) of pedagogic hyperfrequency circuit, when these other corresponding separate elements (1a, 1b, 1c, 1d) of pedagogic hyperfrequency circuit are arranged in the access sides (37) between the pins (340) and are juxtaposed on the corresponding magnetic tray (2) between the tray (2) and the third connection element (3), to form by way of the conductors (11, 12, 31) of the other elements (1, 1a, 1b) and of the third element (3) and by at least one conductor (22) provided on a corresponding external surface (25) of the magnetic tray (2) and intended to be connected to the second conductor (12) of the other corresponding elements (1, 1a, 1b) a pedagogic hyperfrequency circuit incorporating at least one first predefined hyperfrequency function.

In an embodiment, on the side turned towards the conductor (31) the substrate (33) comprises another visual marker (371) for implantation of the layer (38) of foam and of the conductor (31).

The invention claimed is:

1. An element (1, 1a) of pedagogic hyperfrequency circuit, wherein the element (1, 1a) of hyperfrequency circuit is planar and comprises at least one first hyperfrequency electrical conductor (11) and at least one second hyperfrequency electrical conductor (12), which are separated from each other at least by a first electrically insulating support (13) to form a hyperfrequency propagation line (11) capable of functioning at a frequency between 300 MHz and 300 GHz, the element (1, 1a) being known as first element (1, 1a), the first electrically insulating support (13) is formed by a substrate made of dielectric material of predetermined dielectric constant and of predetermined height on the external upper surface (10) of which is located the first conductor (11) and on the second lower surface of which is located the second conductor (12), the second conductor (12) is located between the first support (13) and at least one layer (14) of ferromagnetic material for magnetic fastening of the first element (1, 1a) to a corresponding magnetic tray (2), separate from the first element (1), the first element (1, 1a) having a determined external surface (15), configured to application against a corresponding external surface (25) of the corresponding magnetic tray (2), the determined external surface (15) being conductive of electricity and in electrical contact with the second conductor (12) by means of the layer (14) of ferromagnetic material, which is also made of material conductive of electricity, the second hyperfrequency conductor (12) of the first element (1, 1a) forming a ground plane to be connected electrically to a third corresponding electrical conductor (22) provided at least on the corresponding external surface (25) of the corresponding magnetic tray (2), the first element (1, 1a) having at least one first end zone (17, 17a) configured to be juxtaposed on the corresponding magnetic tray (2) against at least one other corresponding end zone (17, 17b) of another second element (1b) of hyperfrequency circuit, similar to the first element (1, 1a), the first conductor (11) comprises on said at least one first end zone (17) at least one connection part (111, 112) for connection by covering to the corresponding conductor (31) of a third corresponding pedagogic hyperfrequency electric connection element (3) separate from the first element (1, 1a), the second hyperfrequency conductor (12) of the first element (1, 1a) being configured to be connected electrically to the second corresponding hyperfrequency conductor (12) of the second corresponding element (1b) by means of at least the third corresponding electrical conductor (22) of the corresponding magnetic tray (2), the first hyperfrequency conductor (11) of the first element (1, 1a) being configured to be connected electrically to the corresponding first hyperfrequency conductor (11) of the second corresponding element (1b) by means of at least one corresponding electrical conductor (31) of the third corresponding connection element (3) when their end zones (17, 17a, 17b) are juxtaposed between the tray (2) and the third corresponding connection element (3) having its own means (34) for magnetic fastening to the corresponding magnetic tray (2) to form by way of the conductors (22, 11, 12, 31) of the tray (2) and of the first, second and third elements (1, 1a, 1b, 3) a pedagogic hyperfrequency circuit incorporating at least one first predefined hyperfrequency function.

2. The element as claimed in claim 1, wherein the element is of the micro-strip type.

3. A magnetic tray (2), comprising an external application surface for application (25) against at least one corresponding separate element (1, 3) and comprising means (24) for magnetic fastening of the corresponding element (1, 3) to the external surface (25) of the tray,
wherein
the external surface (25) of the magnetic tray (2) comprises a third electrical conductor (22), which extends over the entire upper surface (25) of the latter to constitute a ground plane for electrical contact with a second electrical conductor (12) of at least two corresponding first and second separate elements (1, 1a, 1b) of pedagogic hyperfrequency circuit as claimed in claim 1, when these corresponding first and second elements (1, 1a, 1b) are applied by their determined external surface (15) against the external surface (25) of the magnetic tray (2),
the means (24) for magnetic fastening of the tray extend under the entire application surface (25) and being configured for magnetic fastening, apart from the corresponding first and second elements (1, 1a, 1b), of a third other element (3) of corresponding pedagogic hyperfrequency electric connection which has its own means (34) for magnetic fastening to the magnetic tray (2) and which has a corresponding conductor (31) for electrical connection of the first conductors (11) of the corresponding first and second elements (1, 1a, 1b) when the end zones (17, 17a, 17b) of the corresponding first and second elements (1, 1a, 1b) are juxtaposed between the tray (2) and the third corresponding connection element (3) to form by way of the conductors (22, 11, 12, 31) of the tray (2) and the first, second and third elements (1, 1a, 1b, 3) a pedagogic hyperfrequency circuit incorporating at least one first predefined hyperfrequency function.

4. The tray as claimed in claim 3, wherein the means (24) for magnetic fastening of the tray (2) comprise at least one layer of plasto-magnet (241) and a magnetic plate (242), the layer (241) of plasto-magnet being located between the external surface (25) and the magnetic plate (242), the means (24) for magnetic fastening of the tray (2) extending under the entire external application surface (25) and under the third conductor (22) provided on this application surface (25).

5. The tray as claimed in claim 3, wherein the external surface (25) and the third electrical conductor (22) are amagnetic.

6. A pedagogic hyperfrequency electrical connection element (3) for connection between several other elements (1, 1a, 1b) of hyperfrequency circuit, wherein
the connection element (3) being called third connection element (3),
the connection element (3) comprising a substrate (33) insulating electricity, a conductor (31) and several pins (340) for magnetic fastening to a corresponding separate magnetic tray (2), the pins (340) for magnetic fastening being fixed under the substrate (33) insulating electricity to delimit between the pins (340) located in a zone of the substrate (33) enclosing the conductor (31) several access sides (37) for the other corresponding separate elements (1a, 1b, 1c, 1d) of pedagogic hyperfrequency circuit as claimed in claim 1,
the conductor (31) of the connection element (3) covering and being connected electrically to the first conductor (11) of the other corresponding separate elements (1a, 1b, 1c, 1d) of pedagogic hyperfrequency circuit, when these other corresponding separate elements (1a, 1b, 1c, 1d) of pedagogic hyperfrequency circuit are arranged in the access sides (37) between the pins (340) and are juxtaposed on the corresponding magnetic tray (2) between the tray (2) and the third connection element (3), to form by way of the conductors (11, 12, 31) of the other elements (1, 1a, 1b) and of the third element (3) and by at least one conductor (22) provided on a corresponding external surface (25) of the magnetic tray (2) and intended to be connected to the second conductor (12) of the other corresponding elements (1, 1a, 1b), a pedagogic hyperfrequency circuit incorporating at least one first predefined hyperfrequency function.

7. The element as claimed in claim 6, wherein the conductor (31) of the connection element (3) is fixed to the substrate (33) by means of at least one layer (38) made of compressible material for pressing the conductor (31) of the connection element (3) against the first conductor (11) of the other corresponding separate elements (1a, 1b, 1c, 1d) of pedagogic hyperfrequency circuit, when the latter and the connection element (3) are fixed by the magnetic fixing means to the corresponding magnetic tray (2).

8. The element as claimed in claim 7, wherein the layer (38) made of compressible material is made of foam and the conductor (31) of the connection element (3) is formed by electrically conductive fabric fixed to the layer (38).

9. The element as claimed in claim 7, wherein the layer (38) made of compressible material comprises, for each access side (33), a corresponding branch (3811, 3812, 3813, 3814) of compressible material, turned towards this access side (33).

10. The element as claimed in claim 6, wherein the conductor (31) of the connection element (3) is in the form of a cross comprising two first branches (312, 313) connected face to face to two second branches (311, 314) face to face, each first and second branch (311, 312, 313, 314) being intended to be put in electrical contact with the end of the first conductor (11) of another corresponding separate element (1a, 1b, 1c, 1d) of pedagogic hyperfrequency circuit.

11. The element as claimed in claim 10, wherein the layer (38) made of compressible material comprises, for each access side (33), a corresponding branch (3811, 3812, 3813, 3814) of compressible material, turned towards this access side (33) and the layer of compressible material (38) comprises four separate branches (3811, 3812, 3813, 3814) of compressible material forming a cross, each first branch of the conductor (31) and each second branch of the conductor (31) covering only one corresponding branch of the four branches (3811, 3812, 3813, 3814) of compressible material.

12. The element as claimed in claim 6, wherein the conductor (31) of the connection element (3) is in the form of a T comprising a first branch (312) connected to two second branches (311, 314) face to face, each first and second branch (311, 312, 314) being intended to be put in electrical contact with the end of the first conductor (11) of another corresponding separate element (1a, 1b, 1d) of pedagogic hyperfrequency circuit.

13. The element as claimed in claim 6, wherein the conductor (31) of the connection element (3) is of linear form comprising two first branches (312, 313) connected face to face, each first branch (312, 313) being intended to be put in electrical contact with the end of the first conductor (11) of another corresponding separate element (1b, 1c) of pedagogic hyperfrequency circuit.

14. A wedging element (4) for wedging between a connection element (3) as claimed in claim 6 and a magnetic tray (2), wherein the wedging element (4) comprises at least one support surface (19) free of hyperfrequency electrical conductor and at least one second hyperfrequency electrical conductor (12), the support surface (19) being separated from the second hyperfrequency electrical conductor (12) at least by a first electrically insulating support (13), the wedging element (4) being intended to cooperate with:
at least the corresponding magnetic tray (2), separate from the wedging element,
at least one second element (1b) of hyperfrequency circuit, separate from the wedging element, and
at least the third other corresponding element (3) of pedagogic hyperfrequency electric connection, separate from the wedging element, the wedging element (4) comprising at least one first means (14) for magnetic fastening to the corresponding magnetic tray (2), the wedging element having a determined external surface (15), away from the support surface (19) and configured to the application against the corresponding external surface (25) of the corresponding magnetic tray (2), the wedging element having a second hyperfrequency conductor (12) configured to be connected electrically to the third corresponding electrical conductor (22) provided at least on the corresponding external surface (25) of the corresponding magnetic tray (2), the wedging element (4) having at least one end zone (17, 17a) configured to be juxtaposed on the corresponding magnetic tray (2) against at least one other corresponding end zone (17, 17b) of the second corresponding circuit element (1b), the second hyperfrequency conductor (12) of the wedging element being configured to be connected electrically to the second corresponding hyperfrequency conductor (12) of the second corresponding element (1b) by means of at least the third corresponding electrical conductor (22) of the corresponding magnetic tray (2), the support surface (19) of the wedging element being configured to be supported against the third corresponding connection element (3) when the wedging element (4) is inserted between the third connection element (3) and the tray (2) and when the end zones (17, 17a, 17b) are juxtaposed between the tray (2) and the third corresponding connection element (3) having its own means (34) for magnetic fastening to the corresponding magnetic tray (2), to form a pedagogic hyperfrequency circuit incorporating at least one first predefined hyperfrequency function of the second corresponding element (1b) of hyperfrequency circuit by the conductors (22, 11, 12, 31) of the tray (2), of the wedging element (4) and of the second and third elements (1, 1a, 1b, 3).

15. A teaching case, containing
a first set of several separate elements (1, 1a, 1b, 1c, 1d) of pedagogic hyperfrequency circuit as claimed in claim 1,
at least one separate magnetic tray (2),
a second set of several pedagogic hyperfrequency electrical connection elements (3) for connection between corresponding separate elements (1, 1a, 1b) of hyperfrequency circuit of the first set, wherein each connection element (3) is called third connection element (3), each connection element (3) comprising a substrate (33) insulating electricity, a conductor (13) and several pins (340) for magnetic fastening to the separate magnetic tray (2), the pins (340) for magnetic fastening being fixed under the substrate (33) insulating electricity to delimit between the pins (340) located in a zone of the substrate (33) enclosing the conductor (31) several access sides (37) for the corresponding separate elements (1a, 1b, 1c, 1d) of pedagogic hyperfrequency circuit,
the conductor (31) of the connection element (3) covering and being connected electrically to the first conductor (11) of the corresponding separate elements (1a, 1b, 1c, 1d) of pedagogic hyperfrequency circuit when the separate corresponding elements (1a, 1b, 1c, 1d) of pedagogic hyperfrequency circuit are arranged in the access sides (37) between the pins (340) and are juxtaposed on the separate magnetic tray (2) between the separate magnetic tray (2) and the third connection element (3), to form by way of the conductors (11, 12, 31) of the separate corresponding elements (1, 1a, 1b) of pedagogic hyperfrequency circuit and of the third element (3) and by at least one conductor (22) provided on a corresponding external surface (25) of the separate magnetic tray (2) and intended to be connected to the second conductor (12) of the separate corresponding elements (1, 1a, 1b) of pedagogic hyperfrequency circuit, a pedagogic hyperfrequency circuit incorporating at least one first predefined hyperfrequency function.

* * * * *